United States Patent
Gourlay

(10) Patent No.: US 7,595,588 B2
(45) Date of Patent: Sep. 29, 2009

(54) ELECTROLUMINESCENT DEVICE AND METHOD OF MAKING SAME

(75) Inventor: James Gourlay, Edinburgh (GB)

(73) Assignee: Microemissive Displays Limited, Edinburgh (GB)

( * ) Notice: Subject to any disclaimer, the term of this patent is extended or adjusted under 35 U.S.C. 154(b) by 0 days.

(21) Appl. No.: 10/469,085

(22) PCT Filed: Mar. 21, 2002

(86) PCT No.: PCT/GB02/01372

§ 371 (c)(1),
(2), (4) Date: Aug. 25, 2003

(87) PCT Pub. No.: WO02/078101

PCT Pub. Date: Oct. 3, 2002

(65) Prior Publication Data

US 2004/0097161 A1     May 20, 2004

(30) Foreign Application Priority Data

Mar. 22, 2001    (GB) ................................. 0107236.2

(51) Int. Cl.
  *H05B 33/00*   (2006.01)
  *H05B 33/10*   (2006.01)
  *H01L 51/00*   (2006.01)
  *H01L 25/16*   (2006.01)

(52) U.S. Cl. .................. 313/506; 313/504; 257/79

(58) Field of Classification Search ......... 313/500–512; 315/169.3; 257/778; 428/690, 917
See application file for complete search history.

(56) References Cited

U.S. PATENT DOCUMENTS

| 5,060,027 | A |   | 10/1991 | Hart et al. ..................... 357/17 |
| 5,641,996 | A |   | 6/1997  | Omoya et al. ............... 257/787 |
| 5,703,394 | A |   | 12/1997 | Wei et al. .................... 257/433 |
| 5,747,363 | A |   | 5/1998  | Wei et al. ........................ 438/5 |
| 5,818,404 | A |   | 10/1998 | Lebby et al. .................. 345/82 |
| 5,880,799 | A | * | 3/1999  | Inoue et al. ................. 349/110 |
| 5,929,474 | A | * | 7/1999  | Huang et al. ................ 257/292 |
| 5,937,272 | A | * | 8/1999  | Tang ............................ 438/30 |
| 6,023,073 | A | * | 2/2000  | Strite .......................... 257/40 |
| 6,091,194 | A | * | 7/2000  | Swirbel et al. .............. 313/498 |
| 6,175,345 | B1|   | 1/2001  | Kuribayashi et al. |

(Continued)

FOREIGN PATENT DOCUMENTS

EP      0777276 A2    6/1997

(Continued)

OTHER PUBLICATIONS

Patent Abstracts of Japan, one page English language Abstract for JP 2000-82720, Mar. 2000.

*Primary Examiner*—Sikha Roy
(74) *Attorney, Agent, or Firm*—Howson & Howson LLP

(57) ABSTRACT

In a method of creating an electroluminescent device, a plurality of organic electroluminescent pixels (10) are created on a transparent substrate (7), active electronic circuitry (14) is created on a second separate substrate (15), and the two substrates are assembled together with the active electronic circuitry (14) facing the transparent substrate (7) in such a manner as to form discrete electrical connections (17) between the active electronic circuitry and the organic light emitting diode pixels (10). An insulating matrix material (18) can then be used to fill the space between the substrates (7, 15).

24 Claims, 2 Drawing Sheets

U.S. PATENT DOCUMENTS

| | | | |
|---|---|---|---|
| 6,307,528 B1 * | 10/2001 | Yap | 345/45 |
| 6,339,290 B1 | 1/2002 | Nakaya | 313/506 |
| 6,370,019 B1 * | 4/2002 | Matthies et al. | 361/681 |
| 6,380,681 B1 | 4/2002 | Matsuda et al. | 315/3 |
| 6,383,891 B1 * | 5/2002 | Okamoto | 438/455 |
| 6,426,556 B1 * | 7/2002 | Lin | 257/738 |
| 6,621,168 B2 * | 9/2003 | Sundahl et al. | 257/778 |
| 6,633,134 B1 * | 10/2003 | Kondo et al. | 315/169.3 |
| 6,660,943 B1 | 12/2003 | Gotoh et al. | 174/260 |
| 6,870,186 B2 * | 3/2005 | Park et al. | 257/59 |
| 6,873,093 B2 * | 3/2005 | Yu et al. | 313/112 |
| 2003/0127972 A1 * | 7/2003 | Han et al. | 313/504 |

FOREIGN PATENT DOCUMENTS

| | | |
|---|---|---|
| EP | 08788389 A1 | 11/1998 |
| EP | 883191 A2 * | 12/1998 |
| EP | 0884782 A1 | 12/1998 |
| EP | 0982783 A2 | 3/2000 |
| EP | 1026744 A1 | 8/2000 |
| GB | 2249428 A | 5/1992 |
| JP | 2000-82720 | 3/2000 |
| JP | 2000-323276 A | 11/2000 |
| JP | 2001-022297 A | 1/2001 |
| WO | WO 01/05203 | 1/2001 |

* cited by examiner

ELECTROLUMINESCENT DEVICE AND METHOD OF MAKING SAME

BACKGROUND TO THE INVENTION

This invention relates to a method of creating an electroluminescent device and to a device created using the method.

The integration of optoelectronic and electronic components from different origins and substrates makes possible many advanced systems in diverse applications in photonics. To this end various hybrid integration methods and technologies have been developed.

Examples of heterogeneous integration are flip-chip bonding, epitaxial lift-off, substrate removal and applique bonding, and micro-robotic pick and place.

Heterogeneous integration can allow the manufacture of devices that combine component parts that have different properties (optical, mechanical, electrical, or thermal), realizing a product that has some combination of these properties. It can also be used as a way of combining distinct component parts, which require mutually exclusive manufacturing. Another advantage of this approach is to simplify the manufacture of, or improve the performance of, an end product, by removing the exposure of one component part to a manufacturing step that has a deleterious effect on the components performance in the end product.

This approach has been used to integrate silicon chips onto printed circuit boards. For example, a solder bumped flip chip process was introduced by International Business Machines Corporation in the early 1960's. This technology utilizes solder bumps deposited on wettable terminals on the chip and on the substrate. The solder-bumped chip is flipped and then aligned to the substrate and electrical connections are made by reflow of the solder. Similar flip chip techniques have been used to integrate gallium arsenide (GaAs) photodetector elements onto silicon microchips.

Organic electroluminescent devices have previously been manufactured that incorporate active matrix addressing schemes. Such devices have been demonstrated using polysilicon TFTs (thin film transistors) and CMOS (complementary metaloxide-semiconductor) crystalline silicon as the active addressing material. In all cases, this has involved the electroluminescent pixel structures being manufactured directly onto a substrate that houses the active matrix circuitry. This exposes the active matrix circuitry material to the processing steps required to build the pixel arrays, which can be disadvantageous.

For example, using the methods described in the prior art of the field, to manufacture a device with a CMOS active matrix addressing scheme involves a number of compromising processing steps. The fragile and sensitive CMOS substrate housing the active matrix driving circuitry is exposed to the potentially damaging environment, which is needed to manufacture the diode structures. The CMOS may also be exposed to (depending on whether small molecule, or polymer, emitting materials are used) a range of solvents, vacuum drying, and vacuum metallization processes, all of which can damage CMOS.

Conversely, by building the electroluminescent array onto the CMOS, the encapsulation of the device is compromised. This is because a transparent electrode structure must be processed on top of the light emitting material. This is routinely achieved by the deposition of a very thin layer (approximately 10 nm) of a certain metal, followed by the deposition of a thicker layer of transparent conducting material, typically indium tin oxide (ITO). The deposition of ITO exposes the underlying layers to both an oxygen rich and high temperature environment, both of which can reduce the lifetime of devices. This structure puts an oxygen rich compound (ITO), from. which oxygen can migrate, directly next to either oxygen sensitive, metals or organic materials. The device requires further encapsulation using an impermeable barrier such as glass.

Organic light emitting materials are sensitive to water, oxygen, certain organic solvents, and temperatures much above 100° C. Exposure to any of these can degrade the emissive properties, or cause catastrophic failure of a device. To build efficient diode structures it is also necessary to use other reactive materials in the electrode structures, such as thin layers of calcium, magnesium, or other metals that oxidize readily. To protect these sensitive materials it is necessary to encapsulate the devices, ideally with barrier layers that are impermeable to water and oxygen.

The non-planar topology of the active circuit chip, on which the electroluminescent pixels must be formed, causes difficulties in encapsulation. The non-planar topology can also cause variations in device performance across a pixel, and possibly cause catastrophic effects such as short circuits between the top and bottom electrode.

When active circuitry is used in optical applications, it is usually necessary to include light-blocking layers as part of the manufacturing process. This is to avoid the light affecting the electronics, by causing charge leakage. FIG. 1 shows, in schematic section, a conventional device in which light rays 1 are incident on top electrodes 2 as well as on light-blocking layers 3 between the top electrodes. An underlying dielectric 4 covers an active circuit 5 which is arranged on an active circuit substrate 6.

SUMMARY OF THE INVENTION

I have invented a novel method of manufacturing active matrix displays. My approach involves the heterogeneous integration of two components, one of which contains a pixel array and the other of which contains active matrix driving circuitry. The two are bonded together in such a fashion as to provide an electrically conductive pathway from one to the other so that the pixels can be electrically addressed by the circuitry.

The present invention thus provides a method of creating an electroluminescent device, comprising the steps of creating a plurality of organic electroluminescent pixels on a transparent substrate, creating active electronic circuitry on a second separate substrate, and assembling together the two substrates with the active electronic circuitry facing the transparent substrate in such a manner as to form discrete electrical connections between the active electronic circuitry and the organic electroluminescent pixels.

This approach allows the optimization of manufacturing processes for each separate component. This method leads to several improvements in the performance of the final product over those that can be produced by current single manufacturing processes. The heterogeneous integration method also leads to a more efficient and economic manufacturing cycle.

The present heterogeneous integration method does not expose CMOS to any of the potentially damaging process steps mentioned above, and also enhances encapsulation by removing the need to deposit ITO (or other transparent conducting material) directly onto the upper surface of the electroluminescent device. This is because by dividing the manufacturing process into two distinct halves, it is possible to use a transparent and hermetic material, such as glass, that has been pre-coated with ITO or other transparent conducting material, as the substrate onto which the organic materials are deposited. It is also possible to create areas of insulating material that can act as electrically isolating barriers between pixels. This material is preferably light-absorbing or light-reflecting, so that together with the second electrode discussed below, it blocks light, and separate light-blocking layers are not required.

Each pixel may include one or more electroluminescent layers, each layer comprising a polymer, oligomer, small molecule, or rare earth chelate material. These layers, and optionally other layers for enhancing performance such as a layer of conducting polymer for improved injection, are deposited by a spin-coating, dipcoating, spraying, doctor blading or vacuum deposition method, understood by those familiar with the field. A second electrode is then preferably vacuum deposited via a shadow mask on the organic layers. Typically, this consists of a thin layer of reactive low work function (<4 eV) metal, or metal compound such as lithium fluoride. In a preferred subsequent step, prior to assembling the substrates, the second electrode is completed by encapsulating using a metallic material less reactive than said pads. The thin electrical contact pad layer may in particular be capped by depositing via a shadow mask a thicker layer of the less reactive metal such as aluminum, so that the reactive metal layer is fully encapsulated. A plurality of emissive pixels is formed, each with an independently addressable second metal electrode contact.

In a preferred embodiment of the heterogeneous integration method, the active matrix and the pixel array are first aligned to one another using alignment structures on the active matrix substrate and on the electroluminescent pixel substrate. As the pixel substrate is transparent, this is not a flip chip procedure, so equipment costs are reduced. The active matrix substrate is then bonded to the pixel array so as to provide mechanical strength between the two components and an electrically conducting pathway between the active matrix circuitry and each emissive pixel, so that each pixel can be independently addressed.

The bonding can also involve a two-step process, whereby a plurality of electrical bonds is initially formed between the two components. This can give rise to a small gap spacing which can be filled by using a fluid non-conducting material, such as epoxy resin or other polymeric material, that can be converted into a rigid non-fluid, non-conducting matrix material. This material can be chosen to further improve the overall performance of the device. For instance, the non-conducting material when solidified may improve mechanical strength, thermal expansion mismatch, thermal management, electrical isolation/impedance or some combination of these to improve the reliability and lifetime of the devices. The matrix material may further enhance organic electroluminescent pixel array encapsulation by acting as a desiccant or getter.

The electrical connections between the substrates can be formed by a number of different methods. The connection material may comprise conductive adhesive as an alternative to solder or metal. Low-temperature curing conducting adhesive is particularly appropriate for the preferred method of applying the connection material: patterning by screen, stencil or ink-jet printing to form the electrical and mechanical connections between metal electrodes on the two substrates. This reduces the exposure of the organic materials to elevated temperatures and "wet" processes, and can allow for a plurality of connections to be made on one of the substrates at any one time during manufacture.

Other suitable bonding methods include the use of ultrasonic bonding to form the discrete electrical and mechanical connections between metal electrodes on the two substrates.

An alternative bonding method would involve the application of a material which has an anisotropy in its conductivity to only form the electrical connections between the metal electrodes on the two substrates. This material would be applied as continuous film between the two components, but would only be conductive between the corresponding metal electrodes on the two substrates.

This heterogeneous integration method can be used with a number of different substrates and provide improvements in performance of the finished electroluminescent device. The second substrate preferably comprises a material selected from crystalline silicon, amorphous silicon, polysilicon, silicon on insulator, or an electrically conducting organic material.

The inventive technique effectively isolates the optical and electrical parts of the device, so avoiding detrimental influences. The organic electroluminescent pixels act as an interface between the optical domain and the active electronic circuitry.

By using this approach with a polysilicon, or amorphous silicon, active matrix circuitry device there is an improvement in the pixel fill factor. This is because, typically, using the methods known in the field, the polysilicon circuitry is visible in each pixel of the device. In the device according to the present invention, all the circuitry can be placed discretely behind the pixel, thereby increasing the active area of the pixel. Another advantage is that one can design and apply polysilicon circuitry that requires a larger physical size, as this no longer affects the pixel fill factor which influences the light output and perceived performance of the pixel(s) and device. Coarser physical circuit geometries can often be manufactured more economically providing cost reductions in the manufacturing cycle. The active circuitry is preferably shielded from exposure to any harmful light of particular wavelength emitted from, or striking, the device, and polysilicon is particularly appropriate in this context.

Different substrate materials such as plastics can be used to create devices which are curved, molded to a non-flat shape, or flexible.

This is particularly useful if the active electronic circuitry is created on a plurality of active circuit chips, which chips are combined with the second separate substrate. Methods that allow CMOS chips to be embedded in plastic substrates have recently been demonstrated. This has been achieved by fluidic self assembly of shaped CMOS silicon chip devices into predefined depressions in a plastic substrate followed by a metallization interconnect process.

By incorporating this approach with our heterogeneous integration method it is possible to increase the complexity of active circuitry embedded into a large area flexible electroluminescent device, as the circuitry would not be visible, being hidden behind the pixel structures.

The method advantageously comprises combining a plurality of transparent substrates with different properties, such as different color of emitted light, with a single second separate substrate.

The present invention also provides an electroluminescent device created by the method defined above. Finally, the invention provides an electroluminescent device comprising a plurality of organic electroluminescent pixels on a suitable transparent substrate, and active electronic circuitry on a second separate substrate, said transparent and active substrates being connected by discrete electrical connections between the active electronic circuitry and the organic light emitting diode pixels, a cured, non-fluid, non-conducting matrix material being located between the transparent and active substrates.

BRIEF DESCRIPTION OF THE DRAWINGS

The present invention will now be described in more detail, by way of example only, with reference to the accompanying drawings, in which.

DETAILED DESCRIPTION OF THE PREFERRED EMBODIMENT

Figure 1:
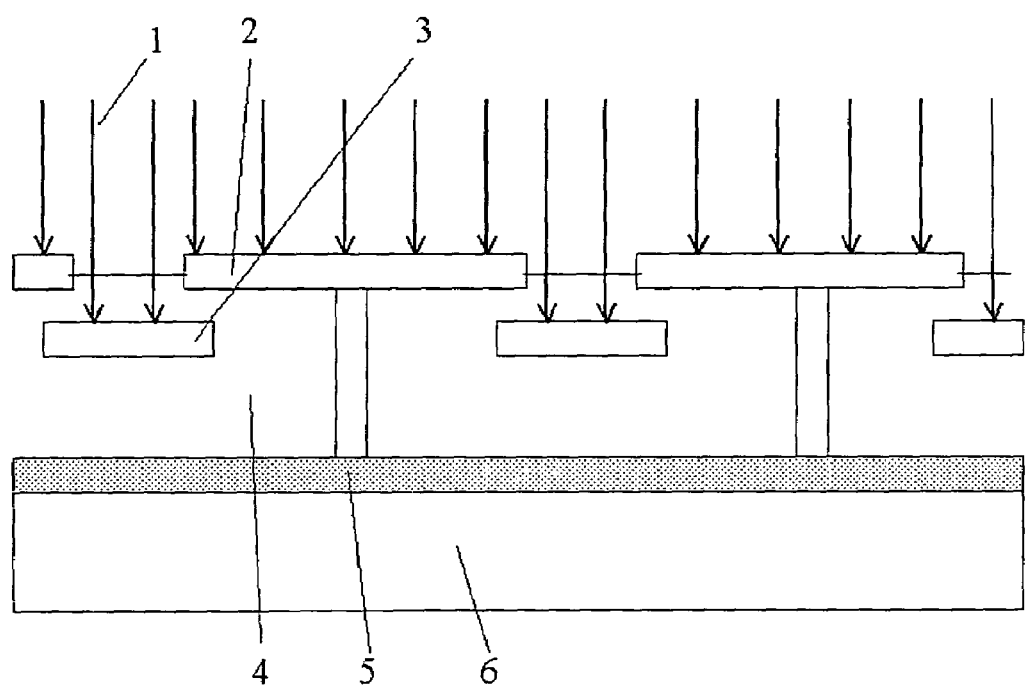
FIG. 1 is a schematic vertical section through the known device comprising light-blocking layers discussed above.
Figure 2:
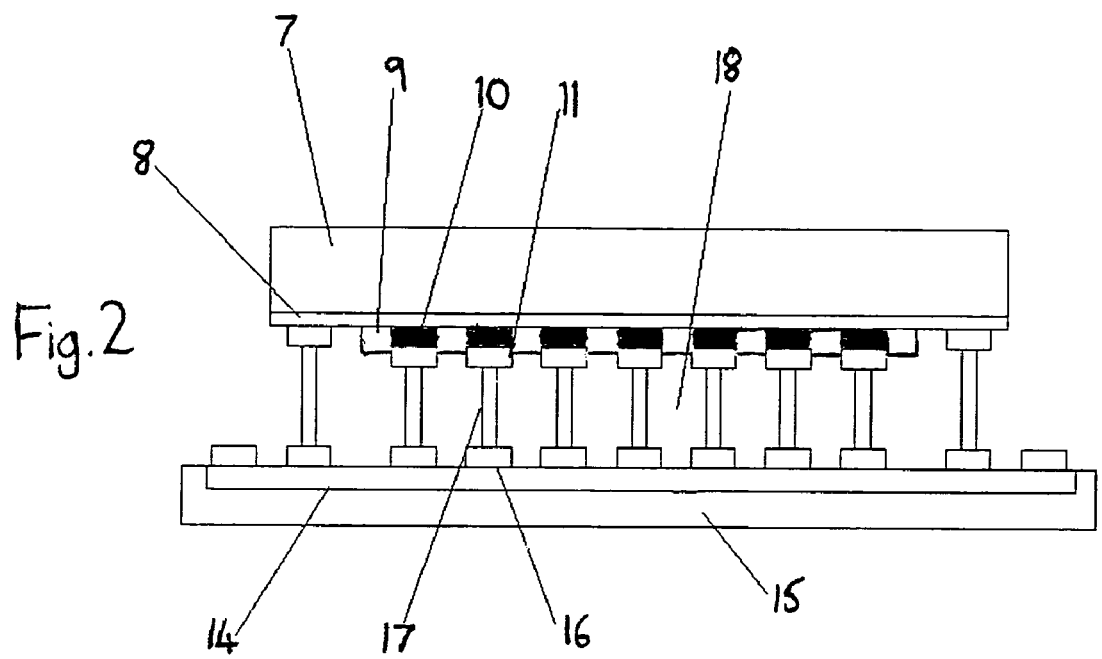
FIG. 2 is a schematic vertical section through a device according to a particular embodiment of the invention.
Figure 3:
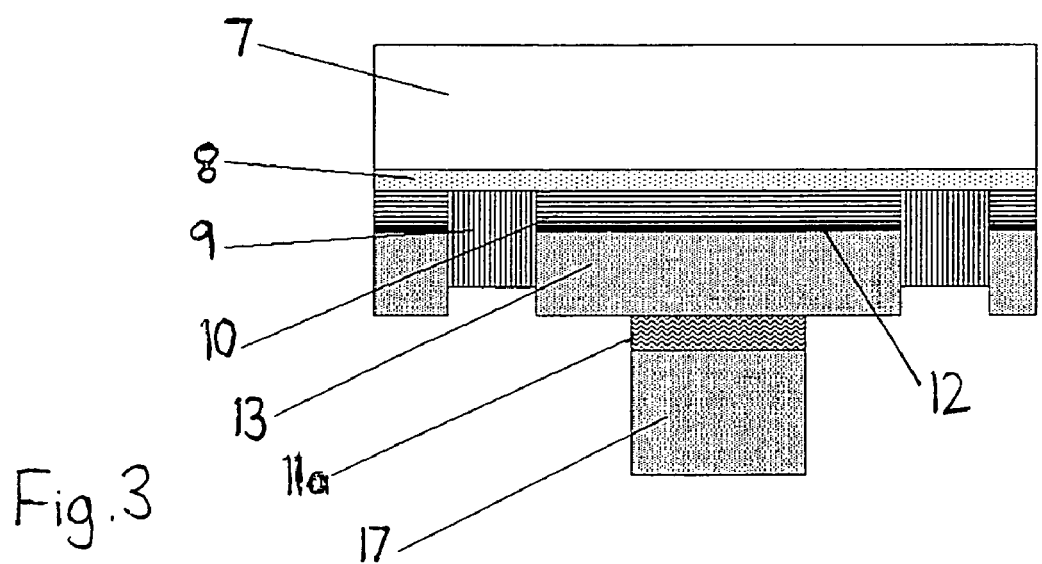
FIG. 3 is a more detailed vertical section through a single pixel of the device shown in FIG. 2.

FIGS. 2 and 3 show a transparent substrate 7, of a material having good hermetic properties, such as glass. In a separate manufacturing process to that of an active circuit chip described below, the transparent substrate 7 is firstly coated with a transparent or semi-transparent electrode 8, preferably comprising ITO. Walls 9 of light-absorbing, electrically insulating material are constructed on the transparent electrode 8 to isolate the pixels electrically and optically. The walls define an array of spaces in each of which an electroluminescent pixel 10 is manufactured on the electrode 8, by a spin-coating, dip-coating, spraying, doctor blading or vacuum deposition method known in the field. The pixel 10 comprises one or more organic electroluminescent layers, each layer comprising a polymer, oligomer, small molecule, or rare earth chelate material. Additionally, the pixel 10 may include one or more inorganic electroluminescent layers, conducting layers and/or barrier layers as known in the art.

A second electrode 11 is then vacuum deposited via a shadow mask on each organic pixel 10. This second electrode consists of a thin layer 12 of reactive low work function (<4 eV) metal, or metal compound such as lithium fluoride. The layer 12 is capped by depositing via a shadow mask a thicker layer 13 of less reactive metal such as aluminum, so that the reactive metal layer 12 is fully encapsulated. A plurality of emissive pixels 10 is formed, each with an independently addressable second metal electrode contact 11.

Active matrix addressing scheme circuitry 14 is separately manufactured by methods known to practitioners in the field, such as CMOS techniques, on a suitable substrate 15. The active matrix pixel circuitry includes metal electrode contact pads 16. The electrode pads may be the only electrically conducting parts of the circuitry that are not protected by insulating layers.

A conducting material, such as a low-temperature curing conducting adhesive, is applied to either or both of, on the one hand, electrical bumps 11a of the second electrodes 11 and on the other hand, the contact pads 16, in such a way that when the components come into contact only a discrete electrical connection 17 is made between the respective contacts of the two substrates 7, 15. When using certain conducting materials to form the electrical connections it may be advantageous to apply the conducting material to both sets of electrical contacts.

Having allowed the electrical contacts to become thermodynamically stable and mechanically strong, it is then possible to fill the space between the discrete electrical contact points with an initially fluid, electrically insulating material 18, such as epoxy resin. This has the effect of further electrically isolating the individual contact points. By judicious prudent choice of this insulating matrix material 18 it is also possible impart further desirable properties to the active matrix organic electroluminescent device, such as improved compliance, thermal expansion matching, mechanical strength, ruggedness, or other desirable properties for improved reliability, yield and lifetime. For example, glass and silicon have different thermal expansion coefficients, and the matrix material 18 can ameliorate the problem of unequal expansion of the substrates 7, 15 by acting as a compliant layer. Also, during heat cycling of the assembled device, the matrix material 18 can assist in absorbing mechanical stresses in the electrical connections 17 between the organic electroluminescent pixels 10 and the active circuitry 14. Additionally, getting and desiccant materials such as barium, zeolites, zirconium and/or silica can be included in the matrix material 18, to reduce leakage of environmental gases and liquids into the pixel area, and thereby improve the device lifetime.

All forms of the verb "to comprise" in this specification mean "to consist of or include".

The invention claimed is:

1. A method of creating an electroluminescent device including a plurality of pixels, comprising the steps of:
   creating a plurality of organic electroluminescent elements on a transparent substrate;
   creating active electronic circuitry on a second separate substrate; and
   assembling together the two substrates with the active electronic circuitry facing the transparent substrate in such a manner as to form discrete electrical connections between the active electronic circuitry and the organic electroluminescent elements with the active electronic circuitry of each pixel being placed directly behind the electroluminescent element of the pixel to which it corresponds.

2. A method according to claim 1, wherein said transparent substrate is coated with an electrically conducting transparent material.

3. A method according to claim 2, wherein the transparent conducting material comprises indium tin oxide.

4. A method according claim 1, further comprising the step of creating areas of insulating material providing electrically isolating barriers between pixels.

5. A method according to claim 1, wherein emissive material used in the organic electroluminescent elements is selected from a group consisting of a polymer, oligomer, small molecule material, and rare earth chelate material.

6. A method according to claim 4, wherein said insulating material is light-absorbing or light-reflecting.

7. A method according to claim 1, wherein a second electrode of each pixel comprises a thinner layer of a one of a reactive metal and a reactive metal compound arranged between the electroluminescent material of the pixel and a thicker layer of a metallic material less reactive than said one of said reactive metal and said reactive metal compound.

8. A method according to claim 1, wherein the electrical connections between the substrates comprise a connection material selected from a group consisting of conductive adhesive, metal, and anisotropic conductive material.

9. A method according to claim 8, wherein the electrical connection material is deposited onto contact pads of one or both substrates by a method selected from screen-printing, stencil-printing and ink-jet printing.

10. A method according to claim 9, wherein a plurality of connections on at least one of the substrates is formed by depositing the connection material in a plurality of locations simultaneously on the respective substrate.

11. A method according to claim 1, wherein the substrates are connected together by ultrasonic bonding.

12. A method according to claim 1, wherein a fluid insulating material is introduced and fills the gaps between the electrical connections between the two substrates and is then converted into a solid matrix.

13. A method according to claim 12, wherein the matrix comprises a material which improves the thermal expansion properties between different materials in the device.

14. A method according to claim 13, wherein the matrix further comprises a desiccant or getter.

15. A method according to claim 1, wherein at least one of the substrates is of plastics material.

16. A method according to claim 1, wherein at least one of the substrates is flexible.

17. A method according to claim 1, wherein at least one of the substrates is non-planar.

18. A method according to claim 1, wherein the active electronic circuitry is created on a plurality of active circuit chips, which chips are combined with the second separate substrate.

19. A method according to claim 1, wherein a plurality of transparent substrates with different properties are combined with a single second separate substrate.

20. A method according to claim 1, wherein said second substrate comprises a material selected from crystalline silicon, amorphous silicon, polysilicon, silicon on insulator, or an electrically conducting organic material.

21. An electroluminescent device including a plurality of pixels comprising a plurality of organic electroluminescent elements on a suitable transparent substrate, and active electronic circuitry on a second separate substrate, said transparent and active substrates being connected by discrete electrical connections between the active electronic circuitry and the organic light emitting diode elements, a cured, non-fluid, non-conducting matrix material being located between the transparent and active substrates, and the active electronic circuitry of each pixel being placed directly behind the electroluminescent element of the pixel to which it corresponds.

22. An electroluminescent device according to claim 21, wherein said second substrate comprises a material selected from crystalline silicon, amorphous silicon, polysilicon, silicon on insulator, or an electrically conducting organic material.

23. An electroluminescent device including a plurality of pixels produced by a process comprising the steps of:
    creating a plurality of organic electroluminescent elements on a transparent substrate;
    creating active electronic circuitry on a second separate substrate; and
    assembling together the two substrates with the active electronic circuitry facing the transparent substrate in such a manner as to form discrete electrical connections between the active electronic circuitry and the organic electroluminescent elements with the active electronic circuitry of each pixel being placed directly behind the electroluminescent element of the pixel to which it corresponds.

24. An electroluminescent device according to claim 23, wherein said second substrate comprises a material selected from crystalline silicon, amorphous silicon, polysilicon, silicon on insulator, or an electrically conducting organic material.

* * * * *